US012696728B2

(12) United States Patent
    Criminale et al.

(10) Patent No.: US 12,696,728 B2
(45) Date of Patent: Jul. 28, 2026

---

(54) METHODS AND MECHANISMS FOR COUPLING SENSORS TO TRANSFER CHAMBER ROBOT

(71) Applicant: Applied Materials, Inc., Santa Clara, CA (US)

(72) Inventors: Phillip Criminale, Liberty Hill, TX (US); Andrew Myles, Sunnyvale, CA (US); Chunlei Zhang, Santa Clara, CA (US); Vivek B. Shah, Santa Clara, CA (US); Upendra Ummethala, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 996 days.

(21) Appl. No.: 17/903,581

(22) Filed: Sep. 6, 2022

(65) Prior Publication Data

US 2023/0089982 A1      Mar. 23, 2023

Related U.S. Application Data

(60) Provisional application No. 63/242,710, filed on Sep. 10, 2021.

(51) Int. Cl.
    *H10P 72/76*         (2026.01)
    *B65G 47/90*         (2006.01)
    (Continued)

(52) U.S. Cl.
    CPC .......... *H10P 72/7602* (2026.01); *B65G 47/90* (2013.01); *G06N 3/08* (2013.01); *H10P 72/0454* (2026.01); *H10P 72/06* (2026.01)

(58) Field of Classification Search
    CPC ......... H01L 21/68707; H01L 21/67167; H01L 21/67242; H01L 21/67253; B65G 47/90;
    (Continued)

(56) References Cited

U.S. PATENT DOCUMENTS

| | | | | |
|---|---|---|---|---|
| 7,560,007 B2 * | 7/2009 | Gaff | ...................... | G01K 11/20 |
| | | | | 156/345.27 |
| 2013/0147437 A1 * | 6/2013 | Yamada | ........... | H01L 21/67259 |
| | | | | 320/128 |

(Continued)

FOREIGN PATENT DOCUMENTS

| | | |
|---|---|---|
| JP | 2004153119 A | 5/2004 |
| JP | 2017505994 A | 2/2017 |

(Continued)

OTHER PUBLICATIONS

PCT Notification of Transmittal of the International Search Report and the Written Opinion of the International Searching Authority for PCT Application No. PCTUS2022042945, mailed Jan. 2, 2023, 14 pages.

*Primary Examiner* — Robert G Bachner
(74) *Attorney, Agent, or Firm* — Lowenstein Sandler LLP

(57) ABSTRACT

An electronic device manufacturing system includes a transfer chamber, a tool station situated within the transfer chamber, a process chamber coupled to the transfer chamber, and a transfer chamber robot. The transfer chamber robot is configured to transfer substrates to and from the process chamber. The transfer chamber robot is further configured to be coupled to a sensor tool comprising one or more sensors configured to take measurements inside the process chamber. The sensor tool is retrievable from the tool station by an end effector of the transfer chamber robot.

14 Claims, 8 Drawing Sheets

(51) Int. Cl.
    *G06N 3/08*         (2023.01)
    *H10P 72/00*      (2026.01)

(58) Field of Classification Search
    CPC ...... G06N 3/08; G06N 3/0442; G06N 3/0464;
                G06N 3/09; G06N 20/10; G06N 3/084
    See application file for complete search history.

(56)           References Cited

U.S. PATENT DOCUMENTS

| | | |
|---|---|---|
| 2014/0312916 A1 | 10/2014 | Mundt |
| 2018/0068881 A1* | 3/2018 | Cavins .............. H01L 21/67265 |
| 2019/0252163 A1 | 8/2019 | Gottscho |
| 2020/0083080 A1 | 3/2020 | Clark |

FOREIGN PATENT DOCUMENTS

| | | |
|---|---|---|
| JP | 2017050535 A | 3/2017 |
| KR | 20200129179 A | 11/2020 |
| KR | 20210021778 A | 3/2021 |
| KR | 20210046079 A | 4/2021 |

* cited by examiner

100

Predictive System 110

Server Machine
170

Training Set
Generator
172

Server Machine 180

Training Engine 182

Validation Engine
184

Selection Engine 185

Testing Engine 186

Model
190

Predictive Server
112

Predictive
Component
114

Data Store 140

Network
130

Manufacturing
Equipment 124

Sensors 126

Client Device 120

Corrective Action
Component 122

Metrology Equipment
128

200

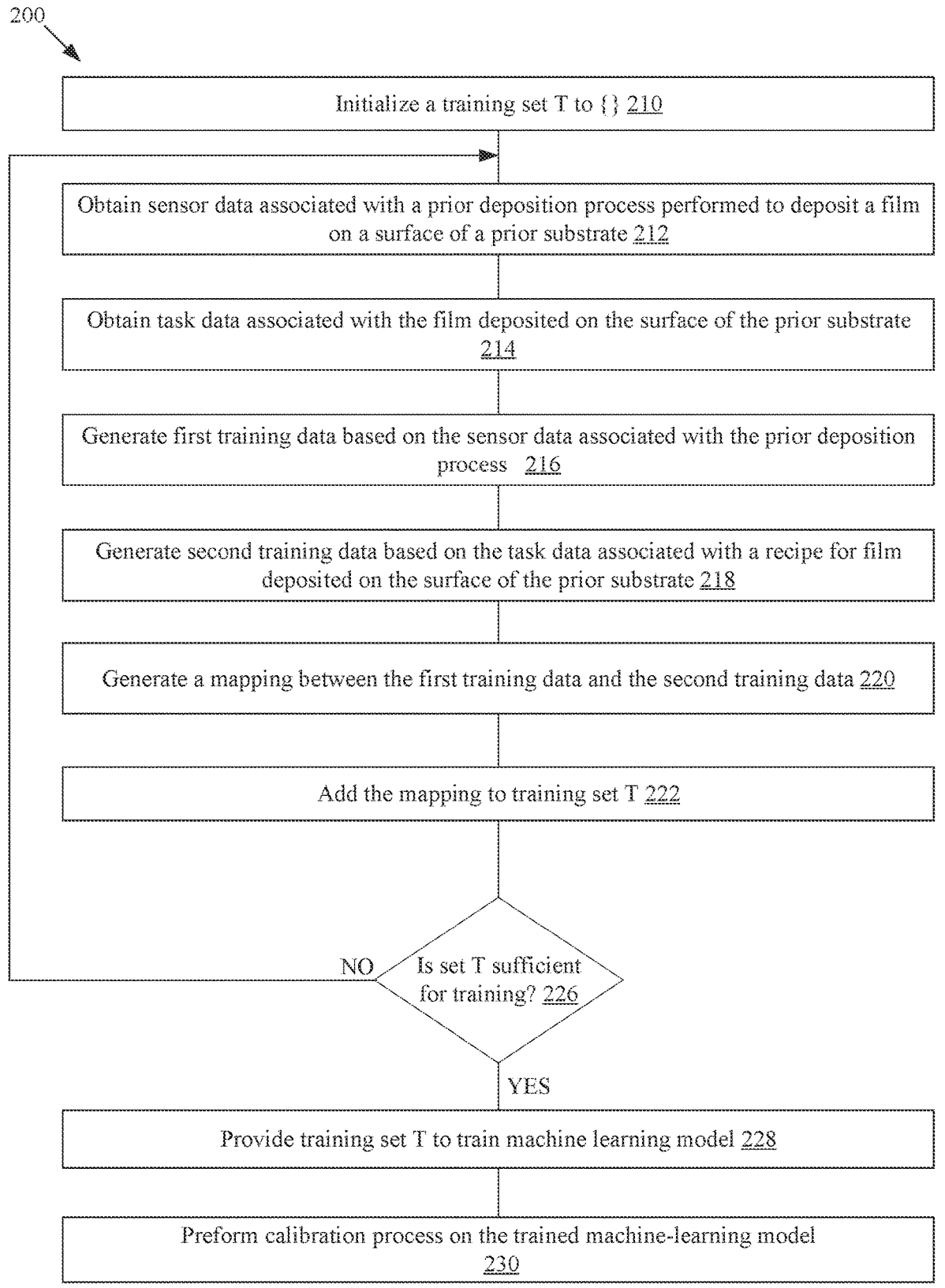

Initialize a training set T to { } 210

Obtain sensor data associated with a prior deposition process performed to deposit a film on a surface of a prior substrate 212

Obtain task data associated with the film deposited on the surface of the prior substrate 214

Generate first training data based on the sensor data associated with the prior deposition process 216

Generate second training data based on the task data associated with a recipe for film deposited on the surface of the prior substrate 218

Generate a mapping between the first training data and the second training data 220

Add the mapping to training set T 222

NO       Is set T sufficient for training? 226

YES

Provide training set T to train machine learning model 228

Preform calibration process on the trained machine-learning model 230

FIG. 2

SYSTEM CONTROLLER 328

DATA STORE 350

Obtain sensor data associated with an operation performed in a process chamber
710

Apply a machine-learning model to the obtained sensor data
712

Generate an output via the machine-learning model based on the sensor data
714

NO        Process chamber sub-system experiencing a failure? 716

YES

Identify a type of failure based on the output
718

Perform a corrective action
720

METHODS AND MECHANISMS FOR COUPLING SENSORS TO TRANSFER CHAMBER ROBOT

RELATED APPLICATION

This application claims the benefit of U.S. Provisional Application No. 63/242,710, filed Sep. 10, 2021, the entire content of which is hereby incorporated by reference.

TECHNICAL FIELD

The present disclosure relates to electrical components, and, more particularly, to methods and mechanisms for coupling sensors to a transfer chamber robot.

BACKGROUND

An electronics manufacturing system generally includes multiple process chambers that are subject to vacuum during operation. During manufacturing of substrates, contaminants and residue deposits are introduced into various components of the process chambers. As such, the process chambers need to be periodically inspected and, based on the level of contamination or level of deposits, cleaned to remove contaminants and residue deposits from the walls and the gas distribution plate.

Traditionally, operators would periodically disengage the vacuum system and remove components of the electronics manufacturing system (such as the process chamber door) to inspect the process chamber and determine whether a cleaning is needed. This, however, is a time-consuming, costly, and ineffective process. Alternatively, some electronics manufacturing systems modify the process chamber walls to include sensors for detecting deposit buildup. However, these wall sensors introduce defects to the process chamber and affect plasma uniformity.

SUMMARY

The following is a simplified summary of the disclosure in order to provide a basic understanding of some aspects of the disclosure. This summary is not an extensive overview of the disclosure. It is intended to neither identify key or critical elements of the disclosure, nor delineate any scope of the particular implementations of the disclosure or any scope of the claims. Its sole purpose is to present some concepts of the disclosure in a simplified form as a prelude to the more detailed description that is presented later.

In an aspect of the disclosure, an electronic device manufacturing system includes a transfer chamber, a tool station situated within the transfer chamber, a process chamber coupled to the transfer chamber, and a transfer chamber robot. The transfer chamber robot is configured to transfer substrates to and from the process chamber. The transfer chamber robot is further configured to be coupled to a sensor tool comprising one or more sensors configured to take measurements inside the process chamber. The sensor tool is retrievable from the tool station by an end effector of the transfer chamber robot.

In another aspect of the disclosure,

In another aspect of the disclosure, a method includes positioning, by a processor, a portion of a transfer chamber robot coupled to a sensor device within a process chamber, the sensor device comprising one or more sensors. The method further includes obtaining, using the one or more sensors, sensor data associated with the process chamber.

The method further includes removing the portion of the transfer chamber robot from the process chamber.

In another aspect of the disclosure, a method includes obtaining, by a sensor device coupled to a transfer chamber robot, a plurality of sensor values from a process chamber. The method further includes applying a machine-learning model to the plurality of sensor values, the machine-learning model trained based on historical sensor data of a sub-system of the process chamber and task data associated with the recipe for depositing the film. The method further includes generating an output of the machine-learning model, wherein the output is indicative of a type of failure of the sub-system. The method further includes determining the type of failure of the sub-system and generating a corrective action based on the type of failure.

BRIEF DESCRIPTION OF THE DRAWINGS

The present disclosure is illustrated by way of example, and not by way of limitation in the figures of the accompanying drawings.

FIG. 2 is a flow diagram of a method for training a machine-learning model, according to certain embodiments.

FIG. 3 is a top schematic view of an example manufacturing system, according to certain embodiments.

FIG. 4 is a cross-sectional schematic side view of an example process chamber of the example manufacturing system, according to certain embodiments.

DETAILED DESCRIPTION

Figure 1:
FIG. 1 is a block diagram illustrating an exemplary system architecture, according to certain embodiments.

Described herein are technologies directed to methods and mechanisms for coupling sensors to a transfer chamber robot. A film can be deposited on a surface of a substrate during a deposition process (e.g., a deposition (CVD) process, an atomic layer deposition (ALD) process, and so forth) performed at a process chamber of a manufacturing system. For example, in a CVD process, the substrate is exposed to one or more precursors, which react on the substrate surface to produce the desired deposit. The film can include one or more layers of materials that are formed during the deposition process, and each layer can include a particular thickness gradient (e.g., changes in the thickness along a layer of the deposited film). For example, a first layer can be formed directly on the surface of the substrate (referred to as a proximal layer or proximal end of the film) and have a first thickness. After the first layer is formed on the surface of the substrate, a second layer having a second thickness can be formed on the first layer. This process continues until the deposition process is completed and a final layer is formed for the film (referred to as the distal layer or distal end of the film). The film can include alternating layers of different materials. For example, the film can include alternating layers of oxide and nitride layers (oxide-nitride-oxide-nitride stack or ONON stack), alternating oxide and polysilicon layers (oxide-polysilicon-oxide-polysilicon stack or OPOP stack), and so forth. The film can then be subjected to, for example, an etch process to form a pattern on the surface of the substrate, a chemical-mechanical polishing (CMP) process to smooth the surface of the film, or any other process necessary to manufacture the finished substrate.

A process chamber can have multiple sub-systems operating during each substrate manufacturing process (e.g., the deposition process, the etch process, the polishing process, etc.). A sub-system can be characterized as a set of sensors related with an operational parameter of the process chamber. An operational parameter can be a temperature, a flow rate, a pressure, and so forth. In an example, a pressure sub-system can be characterized by one or more sensors measuring the gas flow, the chamber pressure, the control valve angle, the foreline (vacuum line between pumps) pressure, the pump speed, and so forth. Accordingly, the process chamber can include a pressure sub-system, a flow sub-system, a temperature subsystem, and so forth. Each sub-system can experience deterioration and deviate from optimal performance conditions. For example, the pressure sub-system can generate reduced pressure due to one or more of pump issues, control valve issues, etc.

During the substrate manufacturing process, the process chamber can experience deteriorating conditions, such as a build-up of contaminant, erosion on certain components, etc. Failure to catch and repair these deteriorating conditions can cause defects in the substrates, leading to inferior products, reduced manufacturing yield, and significant downtime and repair time.

Existing systems may modify the process chamber walls to include sensors for detecting such deteriorating conditions. However, these intrusive wall sensors can introduce defects to the process chamber and affect plasma uniformity. This can cause a delay in achieving optimal process chamber pressure and flow rate of a process gas, which can result in deformations in the deposited and/or etched film. Further, these sensors may be difficult to install because the process chamber may be modified at customer site.

Aspects and implementations of the present disclosure address these and other shortcomings of the existing technology by enabling a transfer chamber robot to equip one or more sensors capable of performing measurements and retrieving data from inside the process chamber. In particular, an electronic device manufacturing system can employ a robot apparatus (e.g., a transfer chamber robot) in the transfer chamber that is configured to transport substrates between a load lock and the process chambers. The transfer chamber, process chambers, and load locks can operate under a vacuum at certain times. The transfer chamber robot can be configured to couple, to its end effector, one or more sensors used to characterize, take readings of, or take measurements of one or more aspects of the process chamber. The sensors may include one or more of an accelerometer, a distance or position sensor (e.g., to determine a height, a width or a length between two objects), a camera (e.g., a high resolution camera, a high speed camera, etc.), a capacitive sensor, a reflectometer, a pyrometer (e.g., a remote sensing thermometer, an infrared camera, etc.), an electronic throttle control, a laser inducted florescence spectroscope, fiber optics (e.g., a fiber optic probe), a surface acoustic sensor, an eddy current sensor, a borescope, a photodiode sensor, a photo multiplier tube, a solid state detector, a thermocouple, a voltage sensor, a current sensor, a resistance sensor, a light source, etc.

In some embodiments, the sensors can be attached to a sensor tool that can be coupled to the end effector. For example, the transfer chamber robot can be configured to attach different sensor tools to its end effector. Alternatively, one or more sensor tools may be permanently attached to the transfer chamber robot's end effector. Each sensor tool can include one or more sensor. A tool station can be used to house, move, change and/or recharge the sensor tools. In some embodiments, the tool station can be an automatic tool changer capable of enabling the process chamber robot to select different sensor tools. The tool station can include an array of sensor tools stored on a magazine or other container (e.g., a drum magazine, a chain type magazine, etc.). Responsive to a selection of a sensor tool, the array of tools can reposition and the process chamber robot can select the target sensor tool from a predetermined position. In some embodiments, responsive to a selection of a sensor tool, the process chamber robot can position the end effector to the specified location of the sensor tool in the tool station. In some embodiments, the tool station can include one or more charging ports for electrically charging each sensor tool. The sensor tools can further include an electronics module capable of facilitating communication (e.g., send and receive data) with the manufacturing system.

In some embodiments, the sensors can be attached to a sensor disc. The sensor disc can be a substrate shaped device that includes one or more sensors. The transfer chamber robot can be configured to retrieve, using an end effector, the sensor disc from a load lock and use the sensor disc to take readings and measurements inside the process chambers. In some embodiments, the sensors disc is connected to a power-link and/or a data-link. The power-link can be any wired or wireless (e.g., inductive) connection capable of providing electrical power, from the process chamber robot, to the sensor(s) using any type of connector (e.g., contact pins, low particle connections, pogo pins). For example, the robot arm or end effector may include one or more types of connectors that can connect to the sensor disc (or other sensor tool) in order to provide power to the sensor tool, a data connection (also referred to as a data-link) to the sensor tool, and so on. In some embodiments, the power-link can be similar or the same system used to provide electrical power to other functions of the transfer chamber robot 112 (e.g., link movement functions, effector operating function, etc.). The data-link can be any wired or wireless (WiFi, Bluetooth, Internet-based, etc.) connection used to provide or retrieve data from the sensor(s). For example, the data-link can be used to provide instructions to the sensors to take measurements or readings, send collected data to an interface (e.g., a user interface) or a data storage system, etc.

In some embodiments, a predictive system can train and apply a machine-learning model to current sensor values to generate an output, such as, one or more values indicative of a fault pattern (e.g., abnormal behavior) of a process chamber sub-system and/or predicative data indicative of the type of fault (e.g., issue, failure, etc.) that occurred. In some embodiments, the output is a value indicative of a difference between the expected behavior of the process chamber sub-system and the actual behavior of the process chamber sub-system. In some embodiments, the value is indicative of a fault pattern associated with the process chamber sub-system. The system can then compare the fault pattern to a library of known fault patterns to determine the type of failure experienced by the sub-system in some embodiments. In some embodiments, the system performs a corrective action to adjust one or more parameters of a deposition process recipe (e.g., a temperature setting for the process chamber, a pressure setting for the process chamber, a flow rate setting for a precursor for a material included in the film deposited on the substrate surface, etc.) based on the fault pattern.

Aspects of the present disclosure result in technological advantages of significant reduction in time that it takes to perform inspection of a process chamber. The configuration allows for the transfer chamber robot to perform inspections and characterize the process chamber periodically or each time the transfer chamber robot places a substrate into the process chamber or retrieves the substrate from the process chamber. The inspections are performed while maintaining the vacuum environment, thus removing any procedure to disengage the vacuum system and remove components of the electronics manufacturing system (such as the process chamber door) associated with manual inspections. The configuration also eliminates the defects to the process chamber and plasma uniformity issues associated with installing sensors within the process chamber. Aspects of the present disclosure further result in technological advantages of significant reduction in time to detect issues or failures experienced by a chamber sub-system, as well as improvements in energy consumption, and so forth. The present disclosure can also result in generating diagnostic data and performing corrective actions to avoid inconsistent and abnormal products, and unscheduled user time or down time.

FIG. 1 depicts an illustrative computer system architecture 100, according to aspects of the present disclosure. In some embodiments, computer system architecture 100 can be included as part of a manufacturing system for processing substrates, such as manufacturing system 300 of FIG. 3. Computer system architecture 100 includes a client device 120, manufacturing equipment 124, metrology equipment 128, a predictive server 112 (e.g., to generate predictive data, to provide model adaptation, to use a knowledge base, etc.), and a data store 140. The predictive server 112 can be part of a predictive system 110. The predictive system 110 can further include server machines 170 and 180. The manufacturing equipment 124 can include sensors 126 configured to capture data for a substrate being processed at the manufacturing system. In some embodiments, the manufacturing equipment 124 and sensors 126 can be part of a sensor system that includes a sensor server (e.g., field service server (FSS) at a manufacturing facility) and sensor identifier reader (e.g., front opening unified pod (FOUP) radio frequency identification (RFID) reader for sensor system). In some embodiments, metrology equipment 128 can be part of a metrology system that includes a metrology server (e.g., a metrology database, metrology folders, etc.) and metrology identifier reader (e.g., FOUP RFID reader for metrology system).

Manufacturing equipment 124 can produce products, such as electronic devices, following a recipe or performing runs over a period of time. Manufacturing equipment 124 can include a process chamber, such as process chamber 400 described with respect to FIG. 4. Manufacturing equipment 124 can perform a process for a substrate (e.g., a wafer, etc.) at the process chamber. Examples of substrate processes include a deposition process to deposit one or more layers of film on a surface of the substrate, an etch process to form a pattern on the surface of the substrate, etc. Manufacturing equipment 124 can perform each process according to a process recipe. A process recipe defines a particular set of operations to be performed for the substrate during the process and can include one or more settings associated with each operation. For example, a deposition process recipe can include a temperature setting for the process chamber, a pressure setting for the process chamber, a flow rate setting for a precursor for a material included in the film deposited on the substrate surface, etc.

In some embodiments, manufacturing equipment 124 includes sensors 126 that are configured to generate data associated with a substrate processed at manufacturing system 100. For example, a process chamber can include one or more sensors configured to generate spectral or non-spectral data associated with the substrate before, during, and/or after a process (e.g., a deposition process) is performed for the substrate. In some embodiments, one or more of the sensors can be coupled (e.g., removably coupled) to a transfer chamber robot. In particular, manufacturing equipment 124 can employ a robot apparatus (e.g., a transfer chamber robot) in a transfer chamber that is configured to transport substrates between a load lock and the process chambers. The process chamber robot is described in greater detail with respect to FIG. 3. In an example, the sensors can be attached to an end effector of the transfer chamber robot that is used to support a substrate. In some embodiments, the sensors can be attached to a sensor tool that can be coupled to and decoupled from the end effector in an automated fashion without the manual intervention of a user. For example, the transfer chamber robot can be configured to attach different sensor tools to its end effector based on positioning the end effector in a manner that engages the end effector with a sensor tool. Further details regarding the sensor tools are provided with respect to FIGS. 5A-5B. In some embodiments, the sensors can be attached to a sensor disc. For example, the transfer chamber robot can be configured to retrieve a sensor disc from a load lock and use the sensor disc to take readings and measurements inside the process chambers. Further details regarding the sensor disc are provided with respect to FIGS. 6A-6B.

In some embodiments, spectral data generated by sensors 126 can indicate a concentration of one or more materials deposited on a surface of a substrate. Sensors 126 configured to generate spectral data associated with a substrate can include reflectometry sensors, ellipsometry sensors, thermal spectra sensors, capacitive sensors, and so forth. Sensors 126 configured to generate non-spectral data associated with a substrate can include temperature sensors, pressure sensors, flow rate sensors, voltage sensors, etc. Further details regarding manufacturing equipment 124 are provided with respect to FIG. 3 and FIG. 4.

In some embodiments, sensors 126 provide sensor data (e.g., sensor values, features, trace data) associated with manufacturing equipment 124 (e.g., associated with producing, by manufacturing equipment 124, corresponding products, such as wafers). The manufacturing equipment 124 may produce products following a recipe or by performing runs over a period of time. Sensor data received over a period of time (e.g., corresponding to at least part of a recipe or run) may be referred to as trace data (e.g., historical trace data, current trace data, etc.) received from different sensors 126 over time. Sensor data can include a value of one or more of temperature (e.g., heater temperature), spacing (SP), pressure, high frequency radio frequency (HFRF), voltage of electrostatic chuck (ESC), electrical current, material flow, power, voltage, etc. Sensor data can be associated with or indicative of manufacturing parameters such as hardware parameters, such as settings or components (e.g., size, type, etc.) of the manufacturing equipment 124, or process parameters of the manufacturing equipment 124. The sensor data can be provided while the manufacturing equipment 124 is performing manufacturing processes (e.g., equipment readings when processing products). The sensor data can be different for each substrate.

Metrology equipment 128 can provide metrology data associated with substrates processed by manufacturing equipment 124. The metrology data can include a value of film property data (e.g., wafer spatial film properties), dimensions (e.g., thickness, height, etc.), dielectric constant, dopant concentration, density, defects, etc. In some embodiments, the metrology data can further include a value of one or more surface profile property data (e.g., an etch rate, an etch rate uniformity, a critical dimension of one or more features included on a surface of the substrate, a critical dimension uniformity across the surface of the substrate, an edge placement error, etc.). The metrology data can be of a finished or semi-finished product. The metrology data can be different for each substrate. Metrology data can be generated using, for example, reflectometry techniques, ellipsometry techniques, TEM techniques, and so forth.

In some embodiments, metrology equipment 128 can be included as part of the manufacturing equipment 124. For example, metrology equipment 128 can be included inside of or coupled to a process chamber and configured to generate metrology data for a substrate before, during, and/or after a process (e.g., a deposition process, an etch process, etc.) while the substrate remains in the process chamber. In such instances, metrology equipment 128 can be referred to as in-situ metrology equipment. In another example, metrology equipment 128 can be coupled to another station of manufacturing equipment 124. For example, metrology equipment can be coupled to a transfer chamber, such as transfer chamber 310 of FIG. 3, a load lock, such as load lock 320, or a factory interface, such as factory interface 306. In such instances, metrology equipment 128 can be referred to as integrated metrology equipment. In other or similar embodiments, metrology equipment 128 is not coupled to a station of manufacturing equipment 124. In such instances, metrology equipment 128 can be referred to as inline metrology equipment or external metrology equipment. In some embodiments, integrated metrology equipment and/or inline metrology equipment are configured to generate metrology data for a substrate before and/or after a process.

The client device 120 may include a computing device such as personal computers (PCs), laptops, mobile phones, smart phones, tablet computers, netbook computers, network connected televisions ("smart TVs"), network-connected media players (e.g., Blu-ray player), a set-top box, over-the-top (OTT) streaming devices, operator boxes, etc. In some embodiments, the metrology data can be received from the client device 120. Client device 120 can display a graphical user interface (GUI), where the GUI enables the user to provide, as input, metrology measurement values for substrates processed at the manufacturing system. The client device 120 can include a corrective action component 122. Corrective action component 122 can receive user input (e.g., via a Graphical User Interface (GUI) displayed via the client device 120) of an indication associated with manufacturing equipment 124. In some embodiments, the corrective action component 122 transmits the indication to the predictive system 110, receives output (e.g., predictive data) from the predictive system 110, determines a corrective action based on the output, and causes the corrective action to be implemented. In some embodiments, the corrective action component 122 receives an indication of a corrective action from the predictive system 110 and causes the corrective action to be implemented. Each client device 120 may include an operating system that allows users to one or more of generate, view, or edit data (e.g., indication associated with manufacturing equipment 124, corrective actions associated with manufacturing equipment 124, etc.).

Data store 140 can be a memory (e.g., random access memory), a drive (e.g., a hard drive, a flash drive), a database system, or another type of component or device capable of storing data. Data store 140 can include multiple storage components (e.g., multiple drives or multiple databases) that can span multiple computing devices (e.g., multiple server computers). The data store 140 can store data associated with processing a substrate at manufacturing equipment 124. For example, data store 140 can store data collected by sensors 126 at manufacturing equipment 124 before, during, or after a substrate process (referred to as process data). Process data can refer to historical process data (e.g., process data generated for a prior substrate processed at the manufacturing system) and/or current process data (e.g., process data generated for a current substrate processed at the manufacturing system). Data store can also store spectral data or non-spectral data associated with a portion of a substrate processed at manufacturing equipment 124. Spectral data can include historical spectral data and/or current spectral data.

The data store 140 can also store contextual data associated with one or more substrates processed at the manufacturing system. Contextual data can include a recipe name, recipe step number, preventive maintenance indicator, operator, etc. Contextual data can refer to historical contextual data (e.g., contextual data associated with a prior process performed for a prior substrate) and/or current process data (e.g., contextual data associated with current process or a future process to be performed for a prior substrate). The contextual data can further include identify sensors that are associated with a particular sub-system of a process chamber.

The data store 140 can also store task data. Task data can include one or more sets of operations to be performed for the substrate during a deposition process and can include one or more settings associated with each operation. For example, task data for a deposition process can include a temperature setting for a process chamber, a pressure setting for a process chamber, a flow rate setting for a precursor for a material of a film deposited on a substrate, etc. In another example, task data can include controlling pressure at a defined pressure point for the flow value. Task data can refer to historical task data (e.g., task data associated with a prior process performed for a prior substrate) and/or current task data (e.g., task data associated with current process or a future process to be performed for a substrate).

In some embodiments, data store 140 can be configured to store data that is not accessible to a user of the manufacturing system. For example, process data, spectral data, contextual data, etc. obtained for a substrate being processed at the manufacturing system is not accessible to a user (e.g., an operator) of the manufacturing system. In some embodiments, all data stored at data store 140 can be inaccessible by the user of the manufacturing system. In other or similar embodiments, a portion of data stored at data store 140 can be inaccessible by the user while another portion of data stored at data store 140 can be accessible by the user. In some embodiments, one or more portions of data stored at data store 140 can be encrypted using an encryption mechanism that is unknown to the user (e.g., data is encrypted using a private encryption key). In other or similar embodiments, data store 140 can include multiple data stores where data that is inaccessible to the user is stored in one or more first data stores and data that is accessible to the user is stored in one or more second data stores.

In some embodiments, data store 140 can be configured to store data associated with known fault patterns. A fault pattern can be a one or more values (e.g., a vector, a scalar, etc.) associated with one or more issues or failures associated with a process chamber sub-system. In some embodiments, a fault pattern can be associated with a corrective action. For example, a fault pattern can include parameter adjustment steps to correct the issue or failure indicated by the fault pattern. For example, the predictive system can compare a determined fault pattern to a library of known fault patterns to determine the type of failure experienced by a sub-system, the cause of the failure, the recommended corrective action to correct the fault, and so forth.

In some embodiments, predictive system 110 includes predictive server 112, server machine 170 and server machine 180. The predictive server 112, server machine 170, and server machine 180 may each include one or more computing devices such as a rackmount server, a router computer, a server computer, a personal computer, a mainframe computer, a laptop computer, a tablet computer, a desktop computer, Graphics Processing Unit (GPU), accelerator Application-Specific Integrated Circuit (ASIC) (e.g., Tensor Processing Unit (TPU)), etc.

Server machine 170 includes a training set generator 172 that is capable of generating training data sets (e.g., a set of data inputs and a set of target outputs) to train, validate, and/or test a machine-learning model 190. Machine-learning model 190 can be any algorithmic model capable of learning from data. Some operations of data set generator 172 is described in detail below with respect to FIG. 2. In some embodiments, the data set generator 172 can partition the training data into a training set, a validating set, and a testing set. In some embodiments, the predictive system 110 generates multiple sets of training data.

Server machine 180 can include a training engine 182, a validation engine 184, a selection engine 185, and/or a testing engine 186. An engine can refer to hardware (e.g., circuitry, dedicated logic, programmable logic, microcode, processing device, etc.), software (such as instructions run on a processing device, a general purpose computer system, or a dedicated machine), firmware, microcode, or a combination thereof. Training engine 182 can be capable of training one or more machine-learning models 190. Machine-learning model 190 can refer to the model artifact that is created by the training engine 182 using the training data (also referred to herein as a training set) that includes training inputs and corresponding target outputs (correct answers for respective training inputs). The training engine 182 can find patterns in the training data that map the training input to the target output (the answer to be predicted), and provide the machine-learning model 190 that captures these patterns. The machine-learning model 190 can use one or more of a statistical modelling, support vector machine (SVM), Radial Basis Function (RBF), clustering, supervised machine-learning, semi-supervised machine-learning, unsupervised machine-learning, k-nearest neighbor algorithm (k-NN), linear regression, random forest, neural network (e.g., artificial neural network), etc.

One type of machine learning model that may be used to perform some or all of the above tasks is an artificial neural network, such as a deep neural network. Artificial neural networks generally include a feature representation component with a classifier or regression layers that map features to a desired output space. A convolutional neural network (CNN), for example, hosts multiple layers of convolutional filters. Pooling is performed, and non-linearities may be addressed, at lower layers, on top of which a multi-layer perceptron is commonly appended, mapping top layer features extracted by the convolutional layers to decisions (e.g. classification outputs). Deep learning is a class of machine learning algorithms that use a cascade of multiple layers of nonlinear processing units for feature extraction and transformation. Each successive layer uses the output from the previous layer as input. Deep neural networks may learn in a supervised (e.g., classification) and/or unsupervised (e.g., pattern analysis) manner. Deep neural networks include a hierarchy of layers, where the different layers learn different levels of representations that correspond to different levels of abstraction. In deep learning, each level learns to transform its input data into a slightly more abstract and composite representation. In a plasma process tuning, for example, the raw input may be process result profiles (e.g., thickness profiles indicative of one or more thickness values across a surface of a substrate); the second layer may compose feature data associated with a status of one or more zones of controlled elements of a plasma process system (e.g., orientation of zones, plasma exposure duration, etc.); the third layer may include a starting recipe (e.g., a recipe used as a starting point for determining an updated process recipe the process a substrate to generate a process result the meets threshold criteria). Notably, a deep learning process can learn which features to optimally place in which level on its own. The "deep" in "deep learning" refers to the number of layers through which the data is transformed. More precisely, deep learning systems have a substantial credit assignment path (CAP) depth. The CAP is the chain of transformations from input to output. CAPs describe potentially causal connections between input and output. For a feedforward neural network, the depth of the CAPs may be that of the network and may be the number of hidden layers plus one. For recurrent neural networks, in which a signal may propagate through a layer more than once, the CAP depth is potentially unlimited.

In one embodiment, one or more machine learning model is a recurrent neural network (RNN). An RNN is a type of neural network that includes a memory to enable the neural network to capture temporal dependencies. An RNN is able to learn input-output mappings that depend on both a current input and past inputs. The RNN will address past and future flow rate measurements and make predictions based on this continuous metrology information. RNNs may be trained using a training dataset to generate a fixed number of outputs (e.g., to determine a set of substrate processing rates, determine modification to a substrate process recipe). One type of RNN that may be used is a long short term memory (LSTM) neural network.

Training of a neural network may be achieved in a supervised learning manner, which involves feeding a training dataset consisting of labeled inputs through the network, observing its outputs, defining an error (by measuring the difference between the outputs and the label values), and using techniques such as deep gradient descent and backpropagation to tune the weights of the network across all its layers and nodes such that the error is minimized. In many applications, repeating this process across the many labeled inputs in the training dataset yields a network that can produce correct output when presented with inputs that are different than the ones present in the training dataset.

A training dataset containing hundreds, thousands, tens of thousands, hundreds of thousands or more sensor data and/or process result data (e.g., metrology data such as one or more thickness profiles associated with the sensor data) may be used to form a training dataset.

To effectuate training, processing logic may input the training dataset(s) into one or more untrained machine learning models. Prior to inputting a first input into a machine learning model, the machine learning model may be initialized. Processing logic trains the untrained machine learning model(s) based on the training dataset(s) to generate one or more trained machine learning models that perform various operations as set forth above. Training may be performed by inputting one or more of the sensor data into the machine learning model one at a time.

The machine learning model processes the input to generate an output. An artificial neural network includes an input layer that consists of values in a data point. The next layer is called a hidden layer, and nodes at the hidden layer each receive one or more of the input values. Each node contains parameters (e.g., weights) to apply to the input values. Each node therefore essentially inputs the input values into a multivariate function (e.g., a non-linear mathematical transformation) to produce an output value. A next layer may be another hidden layer or an output layer. In either case, the nodes at the next layer receive the output values from the nodes at the previous layer, and each node applies weights to those values and then generates its own output value. This may be performed at each layer. A final layer is the output layer, where there is one node for each class, prediction and/or output that the machine learning model can produce.

Accordingly, the output may include one or more predictions or inferences. For example, an output prediction or inference may include one or more predictions of film buildup on chamber components, erosion of chamber components, predicted failure of chamber components, and so on. window). Processing logic determines an error (i.e., a classification error) based on the differences between the output (e.g., predictions or inferences) of the machine learning model and target labels associated with the input training data. Processing logic adjusts weights of one or more nodes in the machine learning model based on the error. An error term or delta may be determined for each node in the artificial neural network. Based on this error, the artificial neural network adjusts one or more of its parameters for one or more of its nodes (the weights for one or more inputs of a node). Parameters may be updated in a back propagation manner, such that nodes at a highest layer are updated first, followed by nodes at a next layer, and so on. An artificial neural network contains multiple layers of "neurons", where each layer receives as input values from neurons at a previous layer. The parameters for each neuron include weights associated with the values that are received from each of the neurons at a previous layer. Accordingly, adjusting the parameters may include adjusting the weights assigned to each of the inputs for one or more neurons at one or more layers in the artificial neural network.

After one or more rounds of training, processing logic may determine whether a stopping criterion has been met. A stopping criterion may be a target level of accuracy, a target number of processed images from the training dataset, a target amount of change to parameters over one or more previous data points, a combination thereof and/or other criteria. In one embodiment, the stopping criteria is met when at least a minimum number of data points have been processed and at least a threshold accuracy is achieved. The threshold accuracy may be, for example, 70%, 80% or 90% accuracy. In one embodiment, the stopping criterion is met if accuracy of the machine learning model has stopped improving. If the stopping criterion has not been met, further training is performed. If the stopping criterion has been met, training may be complete. Once the machine learning model is trained, a reserved portion of the training dataset may be used to test the model.

Once one or more trained machine learning models 190 are generated, they may be stored in predictive server 112 as predictive component 114 or as a component of predictive component 114.

The validation engine 184 can be capable of validating machine-learning model 190 using a corresponding set of features of a validation set from training set generator 172. Once the model parameters have been optimized, model validation may be performed to determine whether the model has improved and to determine a current accuracy of the deep learning model. The validation engine 184 can determine an accuracy of machine-learning model 190 based on the corresponding sets of features of the validation set. The validation engine 184 can discard a trained machine-learning model 190 that has an accuracy that does not meet a threshold accuracy. In some embodiments, the selection engine 185 can be capable of selecting a trained machine-learning model 190 that has an accuracy that meets a threshold accuracy. In some embodiments, the selection engine 185 can be capable of selecting the trained machine-learning model 190 that has the highest accuracy of the trained machine-learning models 190.

The testing engine 186 can be capable of testing a trained machine-learning model 190 using a corresponding set of features of a testing set from data set generator 172. For example, a first trained machine-learning model 190 that was trained using a first set of features of the training set can be tested using the first set of features of the testing set. The testing engine 186 can determine a trained machine-learning model 190 that has the highest accuracy of all of the trained machine-learning models based on the testing sets.

As described in detail below, predictive server 112 includes a predictive component 114 that is capable of providing data indicative of the expected behavior of each sub-system of a process chamber, and running trained machine-learning model 190 on the current sensor data input to obtain one or more outputs. The predictive server 112 can further provide data indicative of the health of the process chamber sub-system and diagnostics. This will be explained in further detail below.

The client device 120, manufacturing equipment 124, sensors 126, metrology equipment 128, predictive server 112, data store 140, server machine 170, and server machine 180 can be coupled to each other via a network 130. In some embodiments, network 130 is a public network that provides client device 120 with access to predictive server 112, data store 140, and other publically available computing devices. In some embodiments, network 130 is a private network that provides client device 120 access to manufacturing equipment 124, metrology equipment 128, data store 140, and other privately available computing devices. Network 130 can include one or more wide area networks (WANs), local area networks (LANs), wired networks (e.g., Ethernet network), wireless networks (e.g., an 802.11 network or a Wi-Fi network), cellular networks (e.g., a Long Term Evolution (LTE) network), routers, hubs, switches, server computers, cloud computing networks, and/or a combination thereof.

It should be noted that in some other implementations, the functions of server machines 170 and 180, as well as predictive server 112, can be provided by a fewer number of machines. For example, in some embodiments, server machines 170 and 180 can be integrated into a single machine, while in some other or similar embodiments, server machines 170 and 180, as well as predictive server 112, can be integrated into a single machine.

In general, functions described in one implementation as being performed by server machine 170, server machine 180, and/or predictive server 112 can also be performed on client device 120. In addition, the functionality attributed to a particular component can be performed by different or multiple components operating together.

In embodiments, a "user" can be represented as a single individual. However, other embodiments of the disclosure encompass a "user" being an entity controlled by a plurality of users and/or an automated source. For example, a set of individual users federated as a group of administrators can be considered a "user."

FIG. 2 is a flow chart of a method 200 for training a machine-learning model, according to aspects of the present disclosure. Method 200 is performed by processing logic that can include hardware (circuitry, dedicated logic, etc.), software (such as is run on a general purpose computer system or a dedicated machine), firmware, or some combination thereof. In one implementation, method 200 can be performed by a computer system, such as computer system architecture 100 of FIG. 1. In other or similar implementations, one or more operations of method 200 can be performed by one or more other machines not depicted in the figures. In some aspects, one or more operations of method 200 can be performed by server machine 170, server machine 180, and/or predictive server 112.

For simplicity of explanation, the methods are depicted and described as a series of acts. However, acts in accordance with this disclosure can occur in various orders and/or concurrently, and with other acts not presented and described herein. Furthermore, not all illustrated acts can be performed to implement the methods in accordance with the disclosed subject matter. In addition, those skilled in the art will understand and appreciate that the methods could alternatively be represented as a series of interrelated states via a state diagram or events. Additionally, it should be appreciated that the methods disclosed in this specification are capable of being stored on an article of manufacture to facilitate transporting and transferring such methods to computing devices. The term article of manufacture, as used herein, is intended to encompass a computer program accessible from any computer-readable device or storage media.

At block 210, processing logic initializes a training set T to an empty set (e.g., { }).

At block 212, processing logic obtains sensor data (e.g., sensor values, features, trace data) associated with a prior deposition process performed to deposit one or more layers of film on a surface of a prior substrate. The sensor data can be further associated with a sub-system of a process chamber. A sub-system can be characterized as a set of sensors related with an operational parameter of the process chamber. An operational parameter can be a temperature, a flow rate, a pressure, and so forth. For example, a pressure sub-system can be characterized by one or more sensors measuring the gas flow, the chamber pressure, the control valve angle, the foreline (vacuum line between pumps) pressure, the pump speed, and so forth. Each process chamber can include multiple different sub-systems, such as a pressure sub-system, a flow sub-system, a temperature sub-system, and so forth.

In some embodiments, the sensor data associated with the deposition process is historical data associated with one or more prior deposition settings for a prior deposition process previously performed for a prior substrate at a manufactur-ing system. For example, the historical data can be historical contextual data associated with the prior deposition process stored at data store 140. In some embodiments, the one or more prior deposition settings can include at least one of a prior temperature setting for the prior deposition process, a prior pressure setting for the prior deposition setting, a prior flow rate setting for a precursor for one or more material of the prior film deposited on the surface of the prior substrate, or any other setting associated with the deposition process. A flow rate setting can refer to a flow rate setting for the precursor at an initial instance of the prior deposition process (referred to as an initial flow rate setting), a flow rate setting for the precursor at a final instance of the prior deposition process (referred to as a final flow rate setting), or a ramping rate for the flow rate of the precursor during the deposition process. In one example, the precursor for the prior film can include a boron-containing precursor or a silicon-containing precursor. In some embodiments, the sensor data can also be associated with a prior etching process performed on the prior substrate, or any other process performed in the process chamber.

At block 214, processing logic obtains task data associated with a recipe for film deposited on the surface of the prior substrate. For example, the task data can a required temperature setting, a pressure setting, a flow rate setting for a precursor for a material of a film deposited on a substrate, etc. Task data can include historical task data for a prior film deposited on a surface of a prior substrate. In some embodiments, the historical task data for the prior film can correspond to a historical task value associated with a recipe for the prior film. Processing logic can obtain the task data from data store 140, in accordance with previously described embodiments.

At block 216, processing logic generates first training data based on the obtained sensor data associated with the prior deposition process performed for the prior substrate. At block 218, processing logic generates second training data based on the task data associated with the recipe for film deposited on the surface of the prior substrate.

At block 220, processing logic generates a mapping between the first training data and the second training data. The mapping refers to the first training data that includes or is based on data for the prior deposition process performed for the prior substrate and the second training data that includes or is based on task data associated with the recipe for film deposited on the surface of the prior substrate, where the first training data is associated with (or mapped to) the second training data. At block 224, processing logic adds the mapping to the training set T.

At block 226, processing logic determines whether the training set, T, includes a sufficient amount of training data to train a machine-learning model. It should be noted that in some implementations, the sufficiency of training set T can be determined based simply on the number of mappings in the training set, while in some other implementations, the sufficiency of training set T can be determined based on one or more other criteria (e.g., a measure of diversity of the training examples, etc.) in addition to, or instead of, the number of input/output mappings. Responsive to determining the training set does not include a sufficient amount of training data to train the machine-learning model, method 200 returns to block 212. Responsive to determining the training set T includes a sufficient amount of training data to train the machine-learning model, method 200 continues to block 228.

At block 228, processing logic provides the training set T to train the machine-learning model. In one implementation, the training set T is provided to training engine 182 of server machine 180 to perform the training. In the case of a neural network, for example, input values of a given input/output mapping are input to the neural network, and output values of the input/output mapping are stored in the output nodes of the neural network. The connection weights in the neural network are then adjusted in accordance with a learning algorithm (e.g., backpropagation, etc.), and the procedure is repeated for the other input/output mappings in the training set T.

In some embodiments, the processing logic can perform outlier detection methods to remove anomalies from the training set T prior to training the machine-learning model. Outlier detection methods can include techniques that identify values that differ significantly from the majority the training data. These values can be generated from errors, noise, etc.

At block 230, processing logic perform a calibration process on the trained machine-learning model. In some embodiments, the processing logic can compare the expected behavior of the process chamber sub-system to current behavior of the process chamber sub-system based on the differences in values between the predictive behavior and the current behavior. For example, the processing logic can compare one or more values associated with the predictive data of the pressure sub-system, the flow sub-system, or the temperature sub-system to one or more values associated with the current measured behavior of the pressure sub-system, the flow sub-system, or the temperature sub-system, respectively.

After block 230, the machine-learning model can be used to generate one or more values indicative of a fault pattern (e.g., abnormal behavior) of the process chamber sub-system, generate predicative data indicative of the type of fault (e.g., issue, failure, etc.), and/or perform a corrective action(s) to correct the suspected issue or failure. The predictive data can be generated by comparing the fault pattern to the library of known fault patterns.

Figure 3:
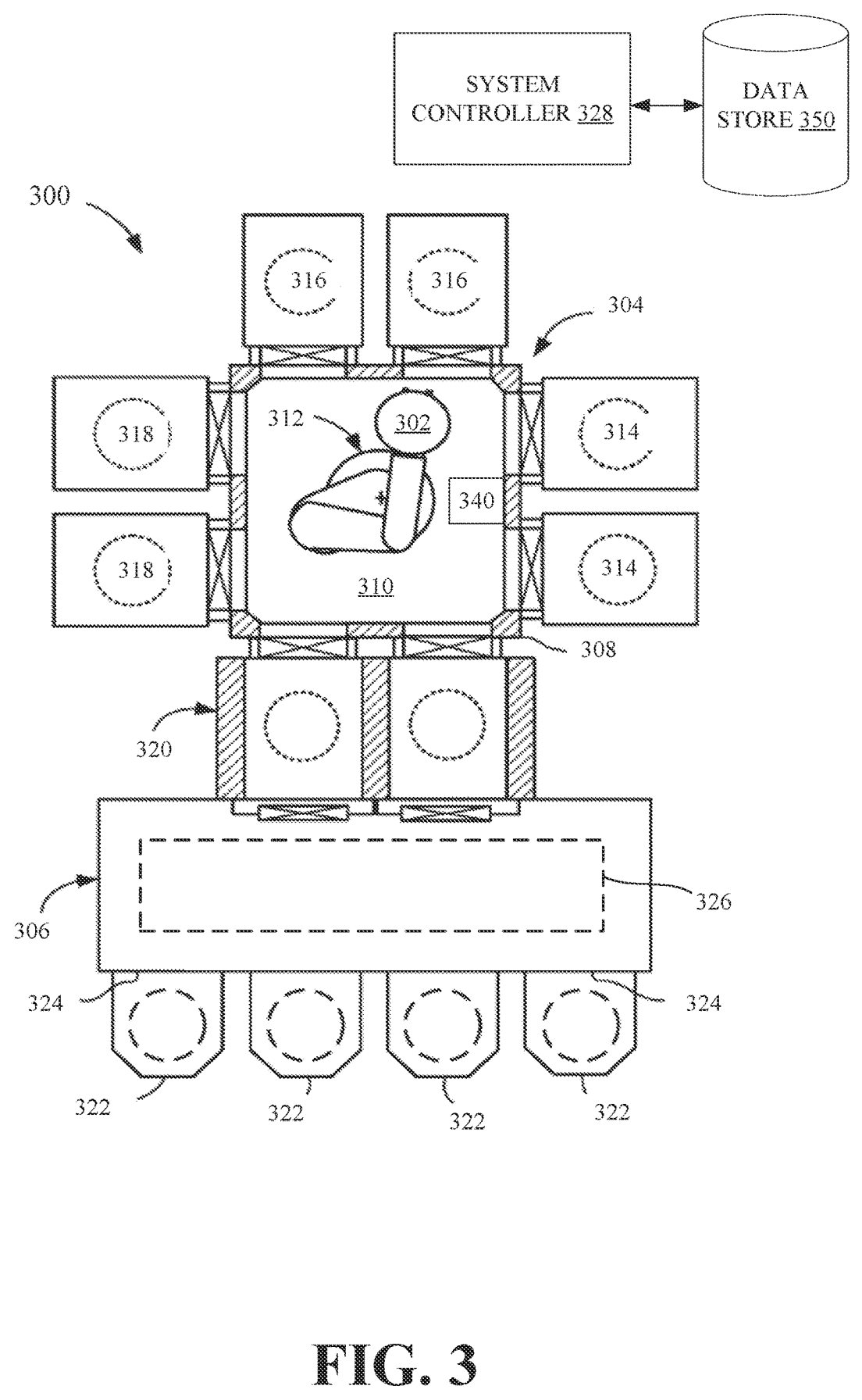

In some embodiments, a manufacturing system can include more than one process chambers. For example, example manufacturing system 300 of FIG. 3 illustrates multiple process chambers 314, 316, 318. It should be noted that, in some embodiments, data obtained to train the machine-learning model and data collected to be provided as input to the machine-learning model can be associated with the same process chamber of the manufacturing system. In other or similar embodiments, data obtained to train the machine-learning model and data collected to be provided as input to the machine-learning model can be associated with different process chambers of the manufacturing system. In other or similar embodiments, data obtained to train the machine-learning model can be associated with a process chamber of a first manufacturing system and data collected to be provide as input to the machine-learning model can be associated with a process chamber of a second manufacturing system.

FIG. 3 is a top schematic view of an example manufacturing system 300, according to aspects of the present disclosure. Manufacturing system 300 can perform one or more processes on a substrate 302. Substrate 302 can be any suitably rigid, fixed-dimension, planar article, such as, e.g., a silicon-containing disc or wafer, a patterned wafer, a glass plate, or the like, suitable for fabricating electronic devices or circuit components thereon.

Manufacturing system 300 can include a process tool 304 and a factory interface 306 coupled to process tool 304. Process tool 304 can include a housing 308 having a transfer chamber 310 therein. Transfer chamber 310 can include one or more process chambers (also referred to as processing chambers) 314, 316, 318 disposed therearound and coupled thereto. Process chambers 314, 316, 318 can be coupled to transfer chamber 310 through respective ports, such as slit valves or the like. Transfer chamber 310 can also include a transfer chamber robot 312 configured to transfer substrate 302 between process chambers 314, 316, 318, load lock 320, etc. Transfer chamber robot 312 can include one or multiple arms where each arm includes one or more end effectors at the end of each arm. The end effector can be configured to handle particular objects, such as wafers, sensor discs, sensor tools, etc. In some embodiments, the end effector can be configured to couple to one or more sensor tools from tool station 340.

Tool station 340 can be a station used to house, move, change and/or recharge the sensor tools. In some embodiments, tool station 340 can be an automatic tool changer capable of enabling the process chamber robot to select different sensor tools. Tool station 340 can include an array of sensor tools stored on a magazine (e.g., a drum magazine, a chain type magazine, etc.) or other container. In some embodiments, responsive to a selection of a sensor tool, the array of tools can reposition and the process chamber robot 312 can select the desired sensor tool from a predetermined position. In some embodiments, responsive to a selection of a sensor tool, the process chamber robot 312 can position the end effector to the specified location of the sensor tool in the tool station. In some embodiments, tool station 340 can include one or more charging ports for electrically charging each sensor tool. For example, when a sensor tool is positioned within the tool station 340 (e.g., on the magazine), the sensor tool's charging component can be connected to (e.g., a wired connection) or within proximity (e.g., wireless connection such as inductive charging) of the charging port. Further detail regarding transfer chamber robot 312 and tool station 340 are provided with respect to FIG. 5A-5B.

In some embodiments, the end effector can be configured to retrieve a sensor disc from a load lock. The sensor disc can be a substrate or any other device that includes one or more sensors. Further detail regarding transfer chamber robot 312 and the sensor disc are provided with respect to FIG. 6A-B.

Process chambers 314, 316, 318 can be adapted to carry out any number of processes on substrates 302. A same or different substrate process can take place in each processing chamber 314, 316, 318. A substrate process can include atomic layer deposition (ALD), physical vapor deposition (PVD), chemical vapor deposition (CVD), etching, annealing, curing, pre-cleaning, metal or metal oxide removal, or the like. Other processes can be carried out on substrates therein. Process chambers 314, 316, 318 can each include one or more sensors configured to capture data for substrate 302 before, after, or during a substrate process. For example, the one or more sensors can be configured to capture spectral data and/or non-spectral data for a portion of substrate 302 during a substrate process. In other or similar embodiments, the one or more sensors can be configured to capture data associated with the environment within process chamber 314, 316, 318 before, after, or during the substrate process. For example, the one or more sensors can be configured to capture data associated with a temperature, a pressure, a gas concentration, etc. of the environment within process chamber 314, 316, 318 during the substrate process.

A load lock 320 can also be coupled to housing 308 and transfer chamber 310. Load lock 320 can be configured to interface with, and be coupled to, transfer chamber 310 on one side and factory interface 306. Load lock 320 can have an environmentally-controlled atmosphere that can be changed from a vacuum environment (wherein substrates can be transferred to and from transfer chamber 310) to an at or near atmospheric-pressure inert-gas environment (wherein substrates can be transferred to and from factory interface 306) in some embodiments. Factory interface 306 can be any suitable enclosure, such as, e.g., an Equipment Front End Module (EFEM). Factory interface 306 can be configured to receive substrates 302 from substrate carriers 322 (e.g., Front Opening Unified Pods (FOUPs)) docked at various load ports 324 of factory interface 306. A factory interface robot 326 (shown dotted) can be configured to transfer substrates 302 between carriers (also referred to as containers) 322 and load lock 320. Carriers 322 can be a substrate storage carrier or a replacement part storage carrier.

Manufacturing system 300 can also be connected to a client device (not shown) that is configured to provide information regarding manufacturing system 300 to a user (e.g., an operator). In some embodiments, the client device can provide information to a user of manufacturing system 300 via one or more graphical user interfaces (GUIs). For example, the client device can provide information regarding a target thickness profile for a film to be deposited on a surface of a substrate 302 during a deposition process performed at a process chamber 314, 316, 318 via a GUI. The client device can also provide information regarding a modification to a process recipe in view of a respective set of deposition settings predicted to correspond to the target profile, in accordance with embodiments described herein.

Manufacturing system 300 can also include a system controller 328. System controller 328 can be and/or include a computing device such as a personal computer, a server computer, a programmable logic controller (PLC), a micro-controller, and so on. System controller 328 can include one or more processing devices, which can be general-purpose processing devices such as a microprocessor, central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets or processors implementing a combination of instruction sets. The processing device can also be one or more special-purpose processing devices such as an application specific integrated circuit (ASIC), a field programmable gate array (FPGA), a digital signal processor (DSP), network processor, or the like. System controller 328 can include a data storage device (e.g., one or more disk drives and/or solid state drives), a main memory, a static memory, a network interface, and/or other components. System controller 328 can execute instructions to perform any one or more of the methodologies and/or embodiments described herein. In some embodiments, system controller 328 can execute instructions to perform one or more operations at manufacturing system 300 in accordance with a process recipe. The instructions can be stored on a computer readable storage medium, which can include the main memory, static memory, secondary storage and/or processing device (during execution of the instructions).

System controller 328 can receive data from sensors included on or within various portions of manufacturing system 300 (e.g., processing chambers 314, 316, 318, transfer chamber 310, load lock 320, etc.). In some embodiments, data received by the system controller 328 can include spectral data and/or non-spectral data for a portion of substrate 302. In other or similar embodiments, data received by the system controller 328 can include data associated with processing substrate 302 at processing chamber 314, 316, 318, as described previously. For purposes of the present description, system controller 328 is described as receiving data from sensors included within process chambers 314, 316, 318. However, system controller 328 can receive data from any portion of manufacturing system 300 and can use data received from the portion in accordance with embodiments described herein. In an illustrative example, system controller 328 can receive data from one or more sensors for process chamber 314, 316, 318 before, after, or during a substrate process at the process chamber 314, 316, 318. Data received from sensors of the various portions of manufacturing system 300 can be stored in a data store 350. Data store 350 can be included as a component within system controller 328 or can be a separate component from system controller 328. In some embodiments, data store 350 can be data store 140 described with respect to FIG. 1.

Figure 4:
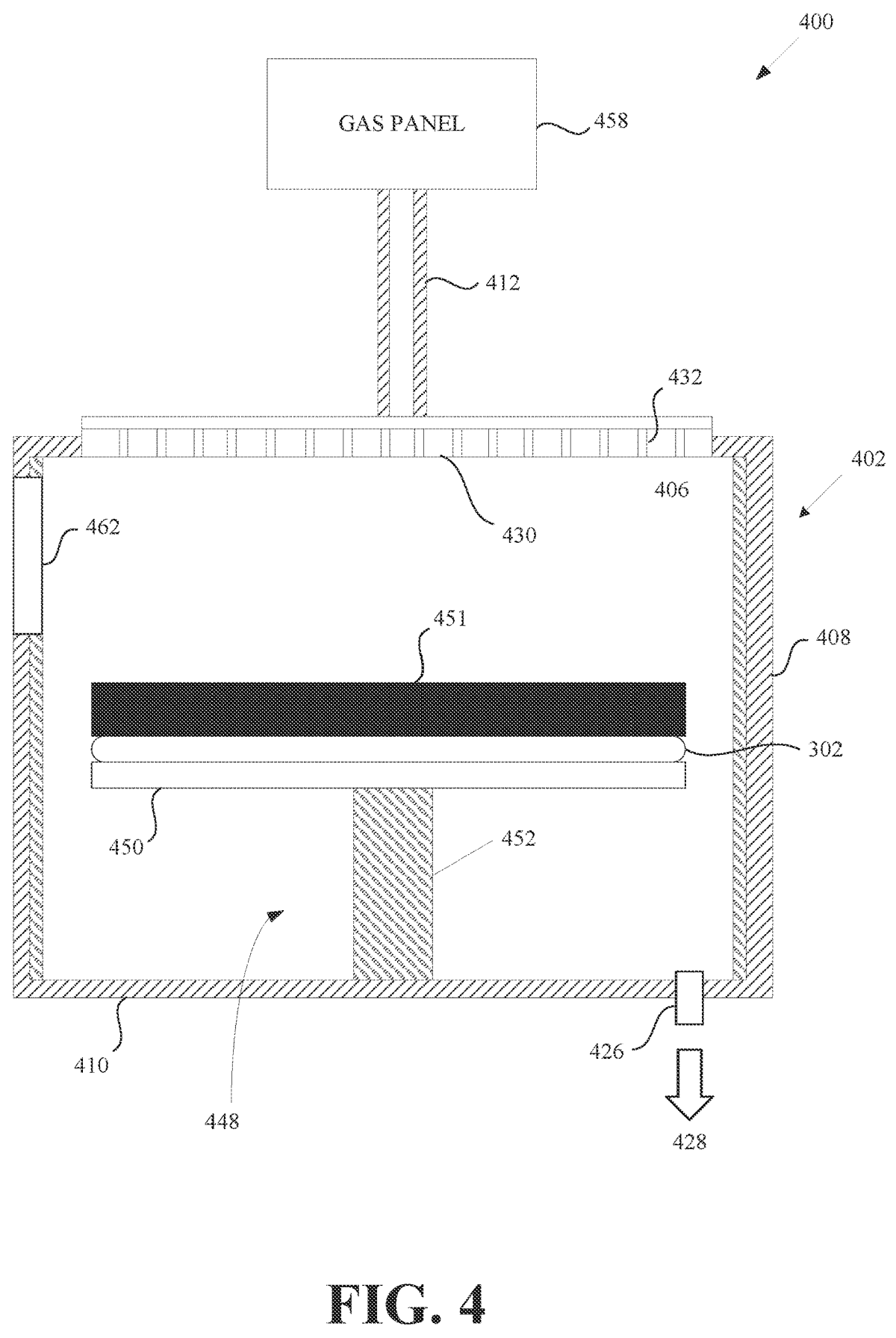

FIG. 4 is a cross-sectional schematic side view of a process chamber 400, in accordance with embodiments of the present disclosure. In some embodiments, process chamber 400 can correspond to process chamber 314, 316, 318, described with respect to FIG. 3. Process chamber 400 can be used for processes in which a corrosive plasma environment is provided. For example, the process chamber 400 can be a chamber for a plasma etcher or plasma etch reactor, and so forth. In another example, process chamber can be a chamber for a deposition process, as previously described. In one embodiment, the process chamber 400 includes a chamber body 402 and a showerhead 430 that encloses an interior volume 406. The showerhead 430 can include a showerhead base and a showerhead gas distribution plate. Alternatively, the showerhead 430 can be replaced by a lid and a nozzle in some embodiments, or by multiple pie shaped showerhead compartments and plasma generation units in other embodiments. The chamber body 402 can be fabricated from aluminum, stainless steel or other suitable material such as titanium (Ti). The chamber body 402 generally includes sidewalls 408 and a bottom 410. An exhaust port 426 can be defined in the chamber body 402, and can couple the interior volume 406 to a pump system 428. The pump system 428 can include one or more pumps and throttle valves utilized to evacuate and regulate the pressure of the interior volume 406 of the process chamber 400.

The showerhead 430 can be supported on the sidewall 408 of the chamber body 402. The showerhead 420 (or lid) can be opened to allow access to the interior volume 406 of the process chamber 400, and can provide a seal for the process chamber 400 while closed. A gas panel 458 can be coupled to the process chamber 400 to provide process and/or cleaning gases to the interior volume 406 through the showerhead 430 or lid and nozzle (e.g., through apertures of the showerhead or lid and nozzle). For example. gas panel 458 can provide precursors for materials of a film 451 deposited on a surface of a substrate 302. In some embodiments, a precursor can include a silicon-based precursor or a boron-based precursor. The showerhead 430 can include a gas distribution plate (GDP) and can have multiple gas delivery holes 432 (also referred to as channels) throughout the GDP. A substrate support assembly 448 is disposed in the interior volume 406 of the process chamber 400 below the showerhead 430. The substrate support assembly 448 holds a substrate 302 during processing (e.g., during a deposition process).

In some embodiments, processing chamber 400 can include metrology equipment (not shown) configured to generate in-situ metrology measurements during a process performed at process chamber 400. The metrology equipment can be operatively coupled to the system controller (e.g., system controller 328, as previously described). In some embodiments, the metrology equipment can be configured to generate a metrology measurement value (e.g., a thickness) for film 451 during particular instances of the deposition process. The system controller can generate a thickness profile for film 451 based on the received metrology measurement values from the metrology equipment. In other or similar embodiments, processing chamber 400 does not include metrology equipment. In such embodiments, the system controller can receive one or more metrology measurement values for film 451 after completion of the deposition process at process chamber 400. System controller can determine a deposition rate based on the one or more metrology measurement values and can associate generate the thickness profile for film 451 based on the determined concentration gradient and the determined deposition rate of the deposition process.

Figure 5A:
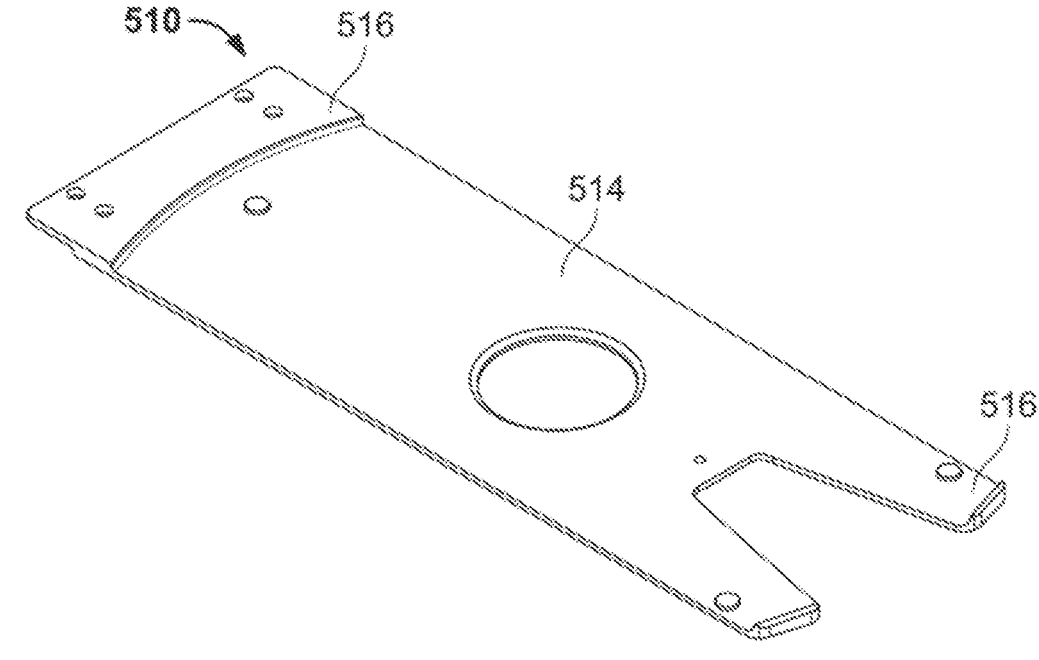
FIG. 5A is a schematic view of an end effector, in accordance with embodiments of the present disclosure.
Figure 5B:
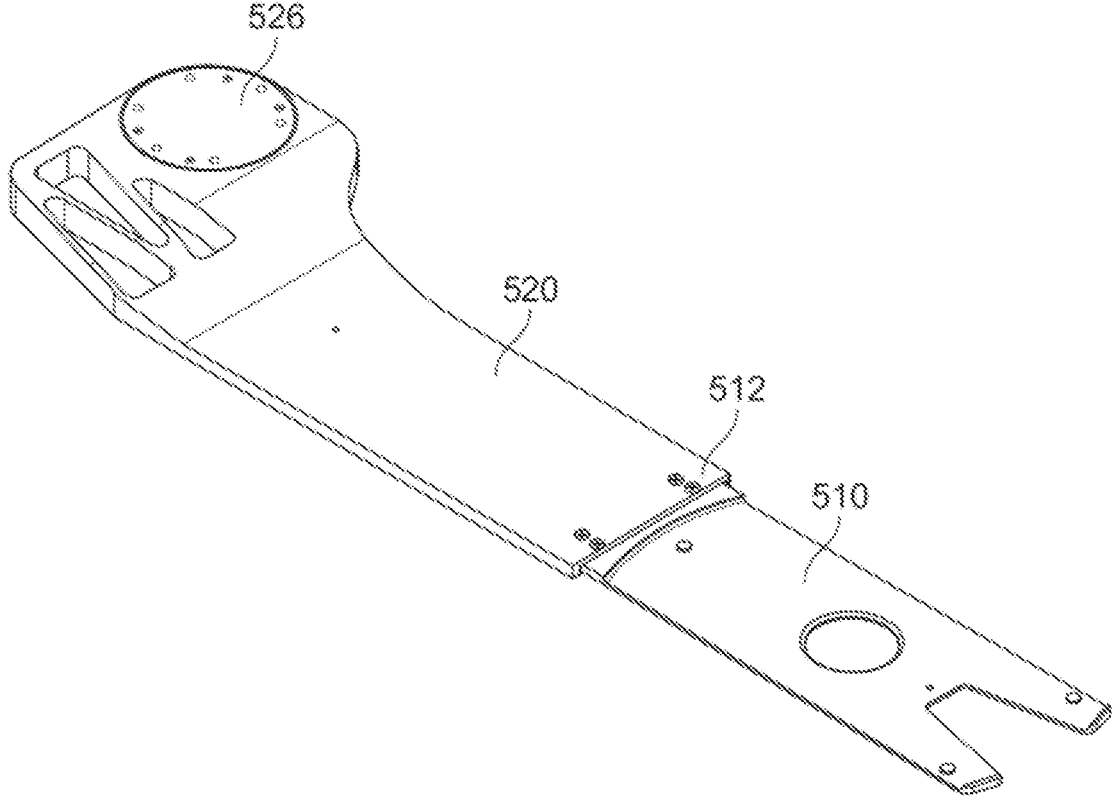
FIG. 5B is a schematic view of an end effector coupled to a sensor tool, in accordance with embodiments of the present disclosure.

FIG. 5A is a schematic view of end effector 510, in accordance with embodiments of the present disclosure. FIG. 5B is a schematic view of end effector 510 coupled to sensor tool 520, in accordance with embodiments of the present disclosure. End effector 510 can include tool connector 512, substrate platform 514, and robot connector 516. In some embodiments, the end effector 510 can include one or more sensors. Sensor tool 520 can include end effector connector 522 and charging component 526.

Robot connector 516 can be used to couple end effector 510 to transfer chamber robot (e.g., transfer chamber robot 310). Substrate platform 514 can be used to handle particular objects, such as substrates (e.g., wafers). Tool connector 512 can be used to couple end effector 510 to sensor tool 520. For example, the transfer chamber robot 312 can receive instructions to couple to a specific sensor tool (e.g., sensor tool 520) housed in the tool station (e.g., tool station 340), position the end effector 510 in a first position in proximity to the end effector connector 522 of sensor tool 520 (e.g., a pre-couple position), place the end effector 510 in a second position to couple the end effector 510 (via tool connector 512) to the end effector connector 522 of sensor tool 520 (e.g., a couple position), and then withdraw the sensor tool 520 from the tool station 340. Upon completion of use of the sensor tool 520, the transfer chamber robot 312 can place the sensor tool 520 back into the tool station 340. In some embodiments, tool station 340 can be configured to automatically couple a selected sensor tool to end effector 510 using, for example, a gripper.

The sensor tool 520 can include one or more sensors. The sensors can be used to characterize, take readings of, or take measurements of one or more aspects of the process chambers 314, 316, 318. The sensors may include one or more of an accelerometer, a distance sensor (e.g., to determine a height, a width or a length between two objects), a camera (e.g., a high resolution camera, a high speed camera, etc.), a capacitive sensor, a reflectometer, a pyrometer (e.g., a remote sensing thermometer, an infrared camera, etc.), a laser inducted florescence spectroscope, fiber optics (e.g., a fiber optic probe), a surface acoustic sensor, an eddy current sensor, a borescope, a photodiode sensor, a photo multiplier tube, a solid state detector, a thermocouple, a voltage sensor, a current sensor, a resistance sensor, or any other type of sensor.

The accelerometer can be used to detect and correct (or calibrate) for vibration and position noise of the transfer chamber robot 312. The distance sensor can be used to detect erosion and/or corrosion on the chuck (table), edge ring, shower head, walls, or any other component of the process chamber 314, 316, 318. For example, during the etching process, an edge ring can be used to promote uniformity along a substrate surface. However, the etching may corrode the edge ring. Accordingly, the position sensor may be used to detect said corrosion by measuring the distance between the top plane of the edge ring and, for example, the top plane of the substrate. The camera can record sections of the process chamber for 314, 316, 318 for visual inspection by an operator. The capacitor sensor can be used to detect the position of the showerhead used for gas distribution inside the process chamber 314, 316, 318, determine the leveling of the substrate, detect erosion, etc. The reflectometer can be used to probe the quality of a seasoning film on the walls of the process chamber 314, 316, 318. For example, the reflectometer can generate a light onto the wall of the process chamber 314, 316, 318, and record the refection index of the light reflected. The pyrometer can be used to detect temperature uniformity of the heater in the process chamber 314, 316, 318, to detect hot spots inside the process chamber 314, 316, 318, etc. The transfer chamber robot 312 can include any quantity or combination of the discussed or other sensors.

In some embodiments, the sensor tool 520 can include an electronics module capable of facilitating communication with system 100 (e.g., system controller 328, predictive system 110, client device 120, etc.). The electronics module can include a microcontroller and a memory buffer coupled to the microcontroller. The memory buffer can be used to collect and store data obtained by the sensor tool 520 before transmitting the data to system 100. In some embodiments, the data can be transmitted using a wireless communication circuit. In other embodiments, the data can be transmitted using a wired connection between the sensor tool 520 and the system 100. For example, end effector connector 522 and/or tool connector 512 can include one or more contact pins, low particle connections, pogo pins, or any other type of connectors that can transfer data (or power) between the sensor tool 520 and the system 100 (via the transfer chamber robot 312). In some embodiments, the data can first be stored (buffered) in the memory buffer prior to being transmitted to the system 100. In other embodiments, the data can be transmitted to the system 100 as the data is collected, without being stored in the memory buffer. In some embodiments, the wireless or wired connection can be continuous. In other embodiments, the wireless or wired connection can be established periodically or upon completion of the inspection or some other triggering event (e.g., when the memory buffer is close to being full, when the sensor tool 520 is positioned on tool station 340, etc.). For example, the sensor tool 520 can include a wired or wireless communication circuit for communicating with the tool station 520. Sensor tool 520 can collect and store sensor data on the memory buffer, and transmit the sensor data once positioned on tool station 340. In some embodiments, tool station 340 can include a wired or wireless connector capable of receiving data (e.g., sensor data) from the sensor tool 520 or transmitting data (e.g., instructions) to the sensor tool 520.

The electronics module can further include a power element and a power-up circuit. For example, the power element can be a battery, a capacitor (such as an ultracapacitor or a supercapacitor), or any other power element capable of providing electrical power to the sensor and/or the electronics module (e.g., a power-link). In some embodiments, the power element can be rechargeable from the tool station 340. For example, while the sensor tool 520 is housed and idle in the tool station 340, the sensor tool 520 can be charged. In particular, the sensor tool 520 can be coupled, via the charging component 526, to a charging port of the tool station 340. In some embodiments, the charging component 526 can be coupled to the charging port using one or more connectors (e.g., contact pins, low particle connections, pogo pins). In other embodiments, the charging component 526 can be positioned within proximity of the charging port and the sensor tool 520 can be charged via wireless charging (e.g., inductive charging).

Figure 6B:
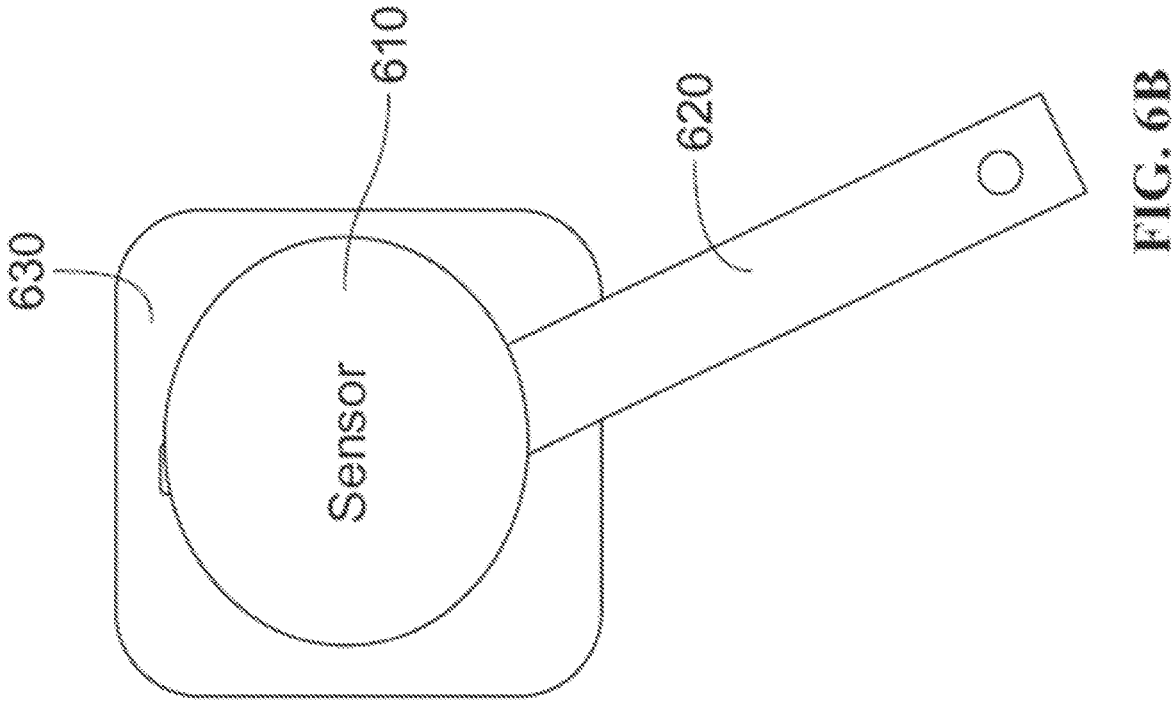
FIGS. 6A and 6B are schematic views of a sensor disc and an end effector, in accordance with embodiments of the present disclosure.
Figure 6A:
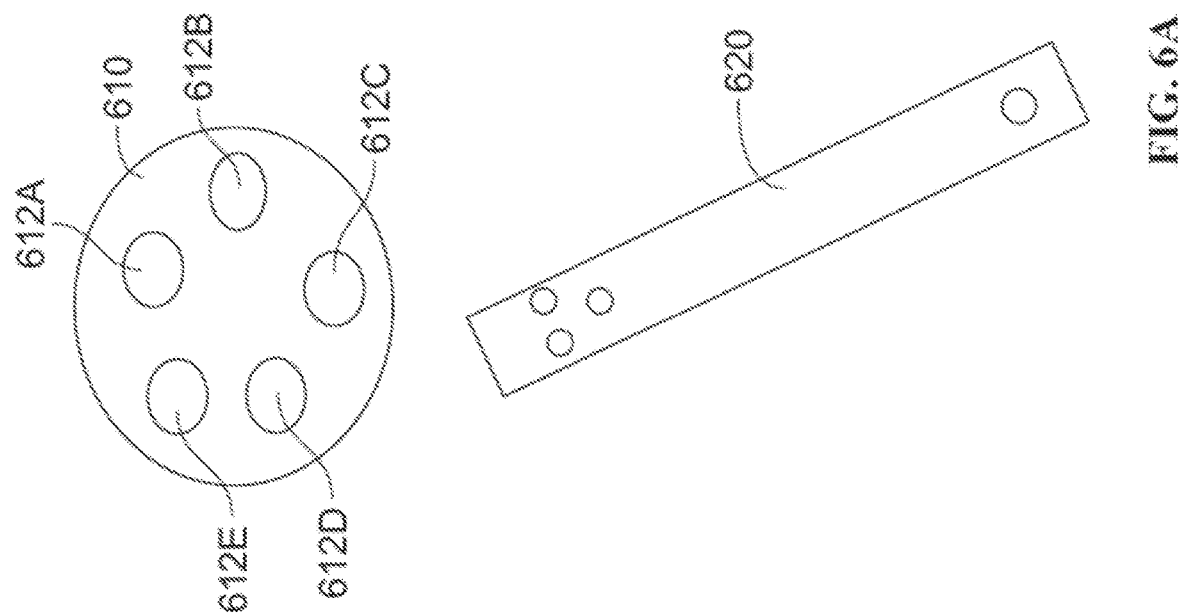

FIGS. 6A and 6B are schematic views of sensor disc 610 and end effector 620, in accordance with embodiments of the present disclosure. End effector 620 can include electric connector 622. Electric connector 622 can be any type of connector (e.g., contact pins, low particle connections, pogo pins) used to provide electrical power and/or transfer data to and from sensor disk 610, which will be explained in more detail below.

The sensor disc 610 can be any device that includes one or more sensors (e.g. sensors 612A-612E). The sensors 612A-612E can be used to characterize, take readings of, or take measurements of one or more aspects of the process chambers 314, 316, 318. The sensors 612A-612E may include one or more of an accelerometer, a distance sensor (e.g., to determine a height, a width or a length between two objects), a camera (e.g., a high resolution camera, a high speed camera, etc.), a capacitive sensor, a reflectometer, a pyrometer (e.g., a remote sensing thermometer, an infrared camera, etc.), a laser inducted florescence spectroscope, fiber optics (e.g., a fiber optic probe), a surface acoustic sensor, an eddy current sensor, a borescope, a photodiode sensor, a photo multiplier tube, a solid state detector, a thermocouple, a voltage sensor, a current sensor, a resistance sensor, or any other type of sensor. While sensor disc 610 illustrates five sensors 612A-612E, it should be understood that any amount of sensors can be coupled to sensor disc 610.

In some embodiments, the sensor disc 610 (and/or the sensors 612A-E) is connected to one or more of a power-link and/or a data-link. The power-link can be any wired (e.g., via electric connector 622) or wireless (e.g., inductive) connection capable of providing electrical power to the sensor(s). In some embodiments, the power-link is similar or the same system used to provide electrical power to other function of the transfer chamber robot 112 (e.g., link movement functions, effector operating function, etc.). In some embodiments, the power-link is a system independent of another power-link used to provide electrical power to the other functions of the transfer chamber robot 312. In some embodiments, the sensor disc 610 can include a power element and/or a power-up circuit. The data-link can be any wired (e.g., via electric connector 622) or wireless (WiFi, Bluetooth, Internet-based, etc.) connection used to provide or retrieve data from the sensor(s). For example, the data-link can be used to provide instructions to the sensors to take measurements or readings, send collected data to an interface (e.g., a user interface) or a data storage system, etc. In some embodiments, the data-link is a system independent of another data-link used to provide instructions and communicate with the transfer chamber robot 312 to enable the transfer chamber robot 312 to transfer and position substrates between the transfer chambers 314, 316, 318 and the load locks 320. In some embodiments, the sensor disc 610 can include an electronics module (e.g., a microcontroller and a memory buffer coupled to the microcontroller) capable of facilitating communication with system 100 (e.g., system controller 328, predictive system 110, client device 120, etc.).

The sensor disc 610 can be handled by the end effector 620. For example, the sensor disc can be housed in a FOUP, which may be docked at a load port 324 of factory interface 306. Factory interface robot 326 can be configured to transfer sensor disc 610 between the FOUP and load lock 320. Transfer chamber robot 312 can position end effector 620 (which is coupled to sensor disc 620) within any process chamber 314, 316, 318. End effector and/an arm of transfer chamber robot may include one or more connectors for connecting to the sensor tool or sensor disc 620. Such connectors may provide a power connection and/or a data-link connection. Using sensor disc 620, transfer chamber robot 312 can take readings and/or measurements of the process chambers. In some embodiments, the sensor(s) and or transfer chamber robot 312 includes a processing device, such as a central processing unit (CPU), microcontroller, a programmable logic controller (PLC), a system on a chip (SoC), a server computer, or other suitable type of computing device. The processing device can be configured to execute programming instructions related to the operation of the sensors. The processing device can receive feedback signals from the sensors device and compute the signals into sensor data (e.g., temperature, video data, position data, etc.). The processing device can further transmit control signals to sensors based on received instructions. In some embodiments, the processing device is configured for high-speed feedback processing, and can include, for example, an EPM. In some embodiments, the processing device is configured to transmit or send the feedback signals and/or the sensor data to an interface (e.g., a user interface), a data store, etc.

Process chamber robot 312 can further be configure to position sensor disc 610 back into the load lock 320. In some embodiments, sensor disc 610 can be of a shape similar to that of a wafer. In other embodiments, sensor disc 610 can be of any shape, including but not limited to, circular, oval, square, rectangular, irregular, etc.

Figure 7:
FIG. 7 is a flow diagram of a method for determining a failure type of a process chamber sub-system using a machine-learning model, according to certain embodiments.

FIG. 7 is a flow chart of a method 700 for determining a failure type of a process chamber sub-system using a machine-learning model, according to aspects of the present disclosure. Method 700 is performed by processing logic that can include hardware (circuitry, dedicated logic, etc.), software (such as is run on a general purpose computer system or a dedicated machine), firmware, or some combination thereof. In one implementation, method 700 can be performed by a computer system, such as computer system architecture 100 of FIG. 1. In other or similar implementations, one or more operations of method 700 can be performed by one or more other machines not depicted in the figures. In some aspects, one or more operations of method 600 can be performed by server machine 170, server machine 180, and/or predictive server 112.

At block 710, processing logic obtains sensor data associated with an operation performed in a process chamber. In some embodiments, the operation can include a deposition process performed in a process chamber to deposit one or more layers of film on a surface of a substrate, an etch process performed on the one or more layers of film on the surface of the substrate, etc. The operation can be performed according to a recipe. The sensor data can include a value of one or more of temperature (e.g., heater temperature), spacing, pressure, high frequency radio frequency, voltage of electrostatic chuck, electrical current, material flow, power, voltage, etc. Sensor data can be associated with or indicative of manufacturing parameters such as hardware parameters, such as settings or components (e.g., size, type, etc.) of the manufacturing equipment 124, or process parameters of the manufacturing equipment 124.

At block 712, processing logic applies a machine-learning model (e.g. model 190) to the obtained sensor data. The machine-learning model can be used to generate one or more values associated with the expected behavior of the process chamber sub-system. For example, the machine-learning model can use an algorithm to generate predictive behavior of the process chamber sub-system using the training set T. In some embodiments, the machine-learning model is trained using historical sensor data of a sub-system of the process chamber and task data associated with the recipe used to perform the operation.

At block 714, processing logic generates an output via the machine-learning model based on the sensor data. In some embodiments, the output can be a value indicative of a pattern (e.g., a fault pattern). In particular, the output can include predicative data of whether the current data is indicative of a failure being experience by the process chamber. In some embodiments, the output can be at least one value indicative of a difference between the expected behavior of the process chamber sub-system and the actual behavior of the process chamber sub-system. In particular, the value(s) can be indicative of a difference between actual values of a set of sensors associated with the sub-system and the expected values of the set of sensors. The failure can include a mechanism failure, high or low pressure, high or low gas flow, high or low temperature, etc.

At block 716, the processing logic determines whether the process chamber sub-system is experiencing a failure. In some embodiments, a failure can include a mechanism failure, high or low pressure, high or low gas flow, high or low temperature, corrosion, erosion, deterioration, etc. In some embodiments, the processing logic can determine whether the process chamber sub-system is experiencing a failure by comparing the output to a predetermined threshold value. In some embodiments, the processing logic can determine whether the process chamber sub-system is experiencing a failure by determining that the output fails to match expected behavior. Responsive to the processing logic determining that the process chamber sub-system is not experiencing a failure (e.g., a value of the output does not exceed the predetermined threshold value), the processing logic can proceed to block 710. Responsive to the processing logic determining that the process chamber sub-system is experiencing a failure (e.g., a value of the output exceeds the predetermined threshold value), the processing logic can proceed to block 718.

At block 718, the processing logic can identify the type of failure based on the output. In some embodiments, the processing logic can compare the fault pattern against the manufacturing data graph(s) and/or a library of known fault patterns to determine the type of failure based on a similarity of the fault pattern when compared to a known fault pattern or the manufacturing data graph(s). In some embodiments, the type of fault can be extracted from the manufacturing data graphs using natural language processing and then associated with the corresponding fault pattern. In some embodiments, the type of failure can be displayed (to a user) on a user interface.

At block 720, the processing logic can perform (or suggest), based on the identified failure, a corrective action. In some embodiments, the corrective action can be determined based on data obtained from the fault library. In some embodiments, the corrective action can include generating an alert or an indication, to the client device 120, of the determined problem. In some embodiments, the corrective action can include the processing logic indicating the type of fault or failure, the cause of the fault or failure, and/or a recommend corrective action. In some embodiments, the corrective action can include the processing logic adjusting one or more parameters of a deposition process recipe (e.g., a temperature setting for the process chamber, a pressure setting for the process chamber, a flow rate setting for a precursor for a material included in the film deposited on the substrate surface, etc.) based on a desired property for the film. In some embodiments, the deposition process recipe can be adjusted before, during (e.g., in real time) or after the deposition process.

Figure 8:
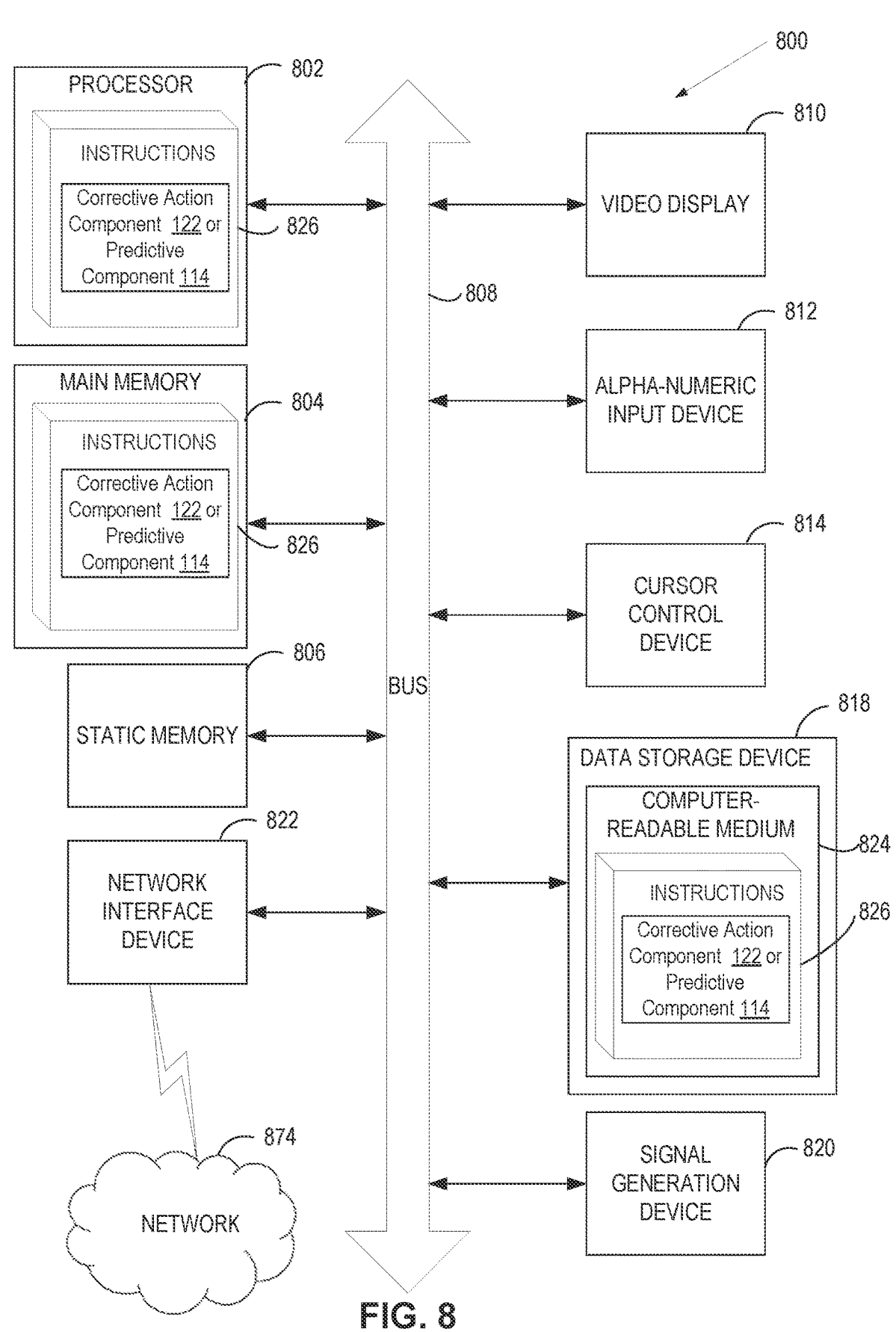
FIG. 8 is a block diagram illustrating a computer system, according to certain embodiments.

FIG. 8 is a block diagram illustrating a computer system 800, according to certain embodiments. In some embodiments, computer system 800 may be connected (e.g., via a network, such as a Local Area Network (LAN), an intranet, an extranet, or the Internet) to other computer systems. Computer system 800 may operate in the capacity of a server or a client computer in a client-server environment, or as a peer computer in a peer-to-peer or distributed network environment. Computer system 800 may be provided by a personal computer (PC), a tablet PC, a Set-Top Box (STB), a Personal Digital Assistant (PDA), a cellular telephone, a web appliance, a server, a network router, switch or bridge, or any device capable of executing a set of instructions (sequential or otherwise) that specify actions to be taken by that device. Further, the term "computer" shall include any collection of computers that individually or jointly execute a set (or multiple sets) of instructions to perform any one or more of the methods described herein.

In a further aspect, the computer system 800 may include a processing device 802, a volatile memory 804 (e.g., Random Access Memory (RAM)), a non-volatile memory 806 (e.g., Read-Only Memory (ROM) or Electrically-Erasable Programmable ROM (EEPROM)), and a data storage device 816, which may communicate with each other via a bus 808.

Processing device 802 may be provided by one or more processors such as a general purpose processor (such as, for example, a Complex Instruction Set Computing (CISC) microprocessor, a Reduced Instruction Set Computing (RISC) microprocessor, a Very Long Instruction Word (VLIW) microprocessor, a microprocessor implementing other types of instruction sets, or a microprocessor implementing a combination of types of instruction sets) or a specialized processor (such as, for example, an Application Specific Integrated Circuit (ASIC), a Field Programmable Gate Array (FPGA), a Digital Signal Processor (DSP), or a network processor).

Computer system 800 may further include a network interface device 822 (e.g., coupled to network 874). Computer system 800 also may include a video display unit 810 (e.g., an LCD), an alphanumeric input device 812 (e.g., a keyboard), a cursor control device 814 (e.g., a mouse), and a signal generation device 820.

In some implementations, data storage device 816 may include a non-transitory computer-readable storage medium 824 on which may store instructions 826 encoding any one or more of the methods or functions described herein, including instructions encoding components of FIG. 1 (e.g., corrective action component 122, predictive component 114, etc.) and for implementing methods described herein.

Instructions 826 may also reside, completely or partially, within volatile memory 804 and/or within processing device

802 during execution thereof by computer system 800, hence, volatile memory 804 and processing device 802 may also constitute machine-readable storage media.

While computer-readable storage medium 824 is shown in the illustrative examples as a single medium, the term "computer-readable storage medium" shall include a single medium or multiple media (e.g., a centralized or distributed database, and/or associated caches and servers) that store the one or more sets of executable instructions. The term "computer-readable storage medium" shall also include any tangible medium that is capable of storing or encoding a set of instructions for execution by a computer that cause the computer to perform any one or more of the methods described herein. The term "computer-readable storage medium" shall include, but not be limited to, solid-state memories, optical media, and magnetic media.

The methods, components, and features described herein may be implemented by discrete hardware components or may be integrated in the functionality of other hardware components such as ASICS, FPGAs, DSPs or similar devices. In addition, the methods, components, and features may be implemented by firmware modules or functional circuitry within hardware devices. Further, the methods, components, and features may be implemented in any combination of hardware devices and computer program components, or in computer programs.

Unless specifically stated otherwise, terms such as "receiving," "performing," "providing," "obtaining," "causing," "accessing," "determining," "adding," "using," "training," or the like, refer to actions and processes performed or implemented by computer systems that manipulates and transforms data represented as physical (electronic) quantities within the computer system registers and memories into other data similarly represented as physical quantities within the computer system memories or registers or other such information storage, transmission or display devices. Also, the terms "first," "second," "third," "fourth," etc. as used herein are meant as labels to distinguish among different elements and may not have an ordinal meaning according to their numerical designation.

Examples described herein also relate to an apparatus for performing the methods described herein. This apparatus may be specially constructed for performing the methods described herein, or it may include a general purpose computer system selectively programmed by a computer program stored in the computer system. Such a computer program may be stored in a computer-readable tangible storage medium.

The methods and illustrative examples described herein are not inherently related to any particular computer or other apparatus. Various general purpose systems may be used in accordance with the teachings described herein, or it may prove convenient to construct more specialized apparatus to perform methods described herein and/or each of their individual functions, routines, subroutines, or operations. Examples of the structure for a variety of these systems are set forth in the description above.

The above description is intended to be illustrative, and not restrictive. Although the present disclosure has been described with references to specific illustrative examples and implementations, it will be recognized that the present disclosure is not limited to the examples and implementations described. The scope of the disclosure should be determined with reference to the following claims, along with the full scope of equivalents to which the claims are entitled.

What is claimed is:

1. An electronic device manufacturing system, comprising:
   a transfer chamber;
   a tool station situated within the transfer chamber;
   a process chamber coupled to the transfer chamber; and
   a transfer chamber robot configured to transfer substrates to and from the process chamber, wherein the transfer chamber robot is configured to be coupled to a sensor tool comprising one or more sensors configured to take measurements inside the process chamber, wherein the sensor tool is retrievable from the tool station by an end effector of the transfer chamber robot.

2. The electronic device manufacturing system of claim 1, wherein the sensor tool further comprises an electronics module capable of facilitating wireless communication via a network.

3. The electronic device manufacturing system of claim 1, wherein the sensor tool further comprises a power element capable of providing electrical power to the one or more sensors.

4. The electronic device manufacturing system of claim 3, wherein the sensor tool further comprises a power-up circuit capable of charging the power element via a charging port of the tool station.

5. The electronic device manufacturing system of claim 1, wherein the end effector comprises one or more electrical connectors for providing at least one of data or electrical power to the sensor tool.

6. The electronic device manufacturing system of claim 1, wherein the sensor tool comprises one or more electrical connectors for receiving at least one of data or electrical power from the transfer chamber robot.

7. The electronic device manufacturing system of claim 1, wherein the one or more sensors comprise at least one of an accelerometer, a distance sensor, a camera, a capacitive sensor, a reflectometer, a pyrometer, a laser induced florescence spectroscope, a fiber optic probe, a surface acoustic sensor, an eddy current sensor, a borescope, a photodiode sensor, a photo multiplier tube, a solid state detector, a thermocouple, a voltage sensor, a current sensor, or a resistance sensor.

8. The electronic device manufacturing system of claim 1, wherein the sensor tool comprises a connector element configured to couple the sensor tool to the end effector.

9. An electronic device manufacturing system, comprising:
   a load lock;
   a transfer chamber coupled to the load lock;
   a process chamber coupled to the transfer chamber; and
   a transfer chamber robot configured to transfer substrates to and from the process chamber, wherein the transfer chamber robot is configured to be coupled to a sensor disc comprising one or more sensors configured to take measurements inside the process chamber, wherein the sensor disc is retrievable from the load lock by an end effector of the transfer chamber robot.

10. The electronic device manufacturing system of claim 9, wherein the end effector comprises one or more electrical connectors for providing at least one of data or electrical power to the sensor disc.

11. The electronic device manufacturing system of claim 9, wherein the sensor disc comprises one or more electrical connectors for receiving at least one of data or electrical power from the transfer chamber robot.

12. The electronic device manufacturing system of claim 9, wherein the sensor disc comprises a data-link capable of sending the measurements to a user interface or a data storage system.

13. The electronic device manufacturing system of claim 9, wherein the one or more sensors comprise at least one of an accelerometer, a distance sensor, a camera, a capacitive sensor, a reflectometer, a pyrometer, a laser induced florescence spectroscope, a fiber optic probe, a surface acoustic sensor, an eddy current sensor, a borescope, a photodiode sensor, a photo multiplier tube, a solid state detector, a thermocouple, a voltage sensor, a current sensor, or a resistance sensor.

14. The electronic device manufacturing system of claim 9, wherein the sensor disc further comprises an electronics module capable of facilitating wireless communication via a network.

* * * * *